United States Patent
Laurent et al.

(10) Patent No.: US 11,035,906 B2
(45) Date of Patent: Jun. 15, 2021

(54) METHOD FOR DETERMINING THE VALUE OF PARAMETERS RELATING TO THE STATE OF AN ACCUMULATOR OF A BATTERY, BATTERY AND ELECTRONIC BATTERY MANAGEMENT SYSTEM

(71) Applicant: SAFT, Levallois-Perret (FR)

(72) Inventors: Sebastien Laurent, Merignac (FR); Philippe Desprez, Bordeaux (FR); Gerard Barrailh, Gradignan (FR)

(73) Assignee: SAFT, Levallois-Perret (FR)

( * ) Notice: Subject to any disclaimer, the term of this patent is extended or adjusted under 35 U.S.C. 154(b) by 101 days.

(21) Appl. No.: 16/093,404

(22) PCT Filed: Apr. 12, 2017

(86) PCT No.: PCT/EP2017/058875
§ 371 (c)(1),
(2) Date: Oct. 12, 2018

(87) PCT Pub. No.: WO2017/178563
PCT Pub. Date: Oct. 19, 2017

(65) Prior Publication Data
US 2019/0064283 A1 Feb. 28, 2019

(30) Foreign Application Priority Data
Apr. 15, 2016 (FR) ...................... 1653355

(51) Int. Cl.
*G01R 31/392* (2019.01)
*G01R 31/396* (2019.01)
(Continued)

(52) U.S. Cl.
CPC ......... *G01R 31/392* (2019.01); *G01R 31/388* (2019.01); *G01R 31/396* (2019.01); *G01R 31/3842* (2019.01)

(58) Field of Classification Search
CPC ... G01V 3/18; G01V 1/52; G01V 3/34; G01V 3/38; G01V 5/04; E21B 47/00;
(Continued)

(56) References Cited

U.S. PATENT DOCUMENTS

| 4,072,200 A * | 2/1978 | Morris ...................... E21B 7/04 175/45 |
| 4,933,640 A * | 6/1990 | Kuckes ............. E21B 47/02216 166/66.5 |

(Continued)

FOREIGN PATENT DOCUMENTS

| FR | 2 920 884 A1 | 3/2009 |
| FR | 3 009 754 A1 | 2/2015 |

OTHER PUBLICATIONS

International Search Report of PCT/EP2017/058875 dated Jul. 19, 2017.

*Primary Examiner* — Giovanni Astacio-Oquendo
(74) *Attorney, Agent, or Firm* — Sughrue Mion, PLLC

(57) ABSTRACT

The invention relates to a method for determining the value of one or more parameters relating to the state of health of at least one accumulator of a battery that is intended to provide electrical energy to an external application, an electronic battery management system implementing this method, and a battery provided with this system. The method comprises the steps consisting in particular in: making a series of measurements of N samples, where N≥3, of at least the voltage, the current and the cumulative capacitance, at the terminals of said accumulator, when charging or discharging said accumulator; —creating a minimization loop by varying a current value of the first parameter of the accumulator from a determined initial value, comprising the following steps: (i) calculating N estimated values of a second parameter linked to the state of charge of the accumulator from the current value of the first
(Continued)

Figure 1:
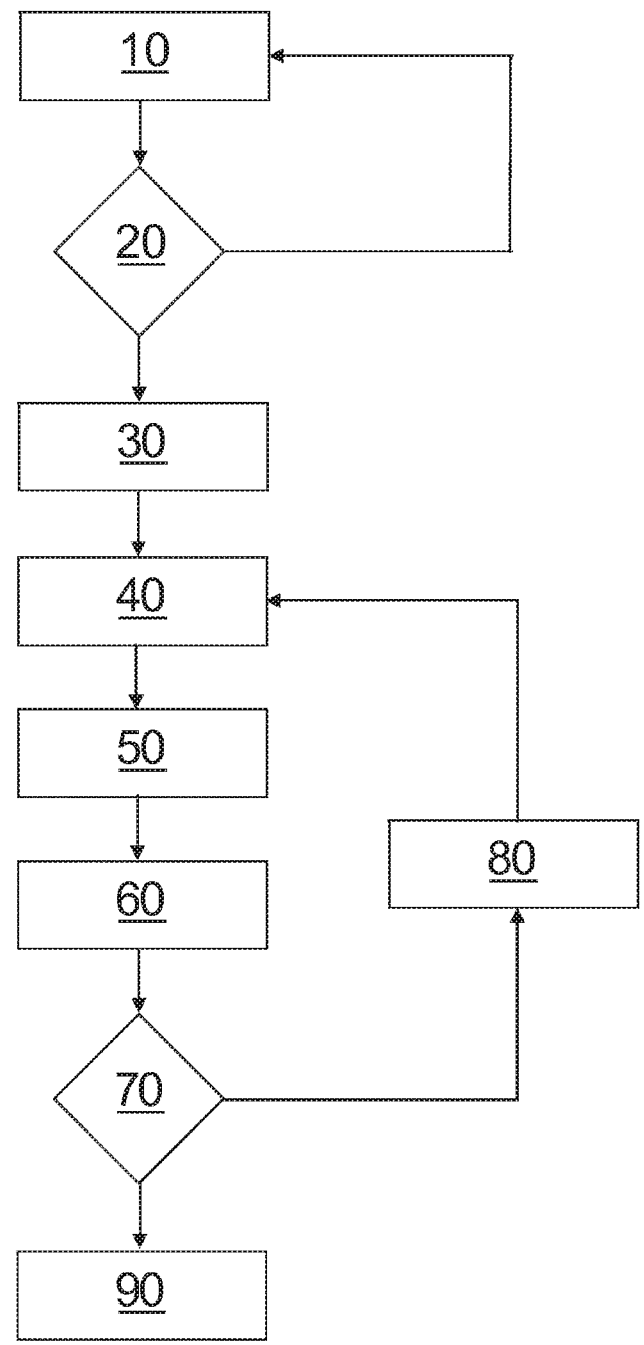

parameter and said N samples, respectively (ii) calculating N theoretical values of the second parameter (iii) varying the current value of the first parameter, repeating the preceding calculation steps for each variation of said current value of the first parameter, and determining the value of the first parameter as being the current value of the first parameter that minimizes the difference between the estimated values and the theoretical values of the second parameter.

33 Claims, 5 Drawing Sheets

(51) Int. Cl.
  *G01R 31/388* (2019.01)
  *G01R 31/3842* (2019.01)
(58) Field of Classification Search
  CPC ......... E21B 4/02; E21B 7/062; G01R 31/392; G01R 31/396; G01R 31/388; G01R 31/3842
  USPC .................. 324/346, 333, 334, 338, 339
  See application file for complete search history.

(56) References Cited

U.S. PATENT DOCUMENTS

| | | | |
|---|---|---|---|
| 2002/0062992 A1* | 5/2002 | Fredericks | G01V 1/52 175/40 |
| 2005/0001627 A1 | 1/2005 | Anbuky et al. | |
| 2007/0120560 A1* | 5/2007 | Rempt | G01N 27/82 324/238 |
| 2012/0176096 A1 | 7/2012 | Mumelter et al. | |
| 2013/0265041 A1* | 10/2013 | Friedrich | G01R 15/207 324/260 |
| 2015/0268309 A1* | 9/2015 | Kim | G01R 31/392 324/432 |
| 2015/0293183 A1* | 10/2015 | Tenmyo | G01R 31/367 324/429 |
| 2015/0323610 A1* | 11/2015 | Ahn | H02J 7/0021 320/152 |

* cited by examiner

METHOD FOR DETERMINING THE VALUE OF PARAMETERS RELATING TO THE STATE OF AN ACCUMULATOR OF A BATTERY, BATTERY AND ELECTRONIC BATTERY MANAGEMENT SYSTEM

CROSS REFERENCE TO RELATED APPLICATIONS

This application is a National Stage of International Application No. PCT/EP2017/058875 filed Apr. 12, 2017, claiming priority based on French Patent Application No. 1653355 filed Apr. 15, 2016.

FIELD OF THE INVENTION

The present invention concerns a method for determining the value of one or more parameters relating to the state of health of at least one accumulator of a battery intended to provide electrical energy to an external application. The invention also relates to an electronic system for managing a battery implementing this method, and to a battery provided with this system.

In the present description, with misuse of language but for the purpose of simplification the expression "determination of a parameter" is sometimes used instead of the expression "determination of the value of a parameter" but designates the same operation.

BACKGROUND OF THE INVENTION

Typically, a battery comprises one of more current accumulators also called electrochemical generators, cells or elements. An accumulator is an electricity-producing device in which chemical energy is converted to electrical energy. The chemical energy derives from electrochemically active compounds deposited on at least on one side of electrodes arranged in the accumulator. Electrical energy is produced by electrochemical reactions when the accumulator is discharging. The electrodes, arranged in a container, are electrically connected to current output terminals which ensure electrical continuity between the electrodes and an electricity consumer with which the accumulator is associated.

To increase delivered electrical power, several individually sealed accumulators can be associated together to form a battery. A battery can therefore be divided into modules, each module being composed of one or more accumulators connected together in series and/or in parallel. For example, a battery may comprise one or more parallel branches of accumulators connected in series and/or one or more parallel branches of modules connected in series.

A charge circuit is generally provided to which the battery can be connected to recharge the accumulators.

In addition, an electronic management system comprising measurement sensors and an electronic control circuit that is more or less sophisticated depending on applications can be associated with the battery. With said system, it is possible in particular to organize and control the charging and discharging of the battery, to balance the charge and discharge of the different accumulators of the battery in relation to each other.

The State Of Charge (SOC) and the State Of Health (SOH) are items of information useful for the electronic management system of a battery, to optimize the utilization and lifetime thereof.

The state of health SOH of the battery allows estimation of the ageing of a battery between its original new state and end-of-life state.

One first method to determine the SOH of a battery, called static method, is to monitor the temperature, voltage and optionally the current values of the battery to determine a SOH value from ageing laws. These ageing laws are obtained from laboratory-conducted tests. A SOH algorithm gives an estimate of ageing of the battery. However, this SOH battery determination method comes under the assumption that ageing of the battery accumulators is homogeneous. The SOH determination method using a predictive model assumes the accuracy of this model and in addition a non-faulty power circuit between the accumulators.

A second, so-called dynamic, method to determine the SOH of a battery is to calculate the ratio between battery resistance at a given time and battery resistance when new under the same measuring conditions (in particular same temperature conditions). In this case, the term SOH related to battery resistance is used (SOHR: State of Health related to battery Resistance). SOH can additionally be calculated from the ratio between the capacity of the battery at a given time and the original rated capacity of the battery under the same measuring conditions (in particular same temperature conditions). In this case, the term SOH related to battery capacity is used (SOHC State of Health related to battery Capacity).

Depending on battery size and/or applications, computing of SOH can be provided for the battery as a whole or for each module, or for each accumulator.

From document FR 2 963 109 a method is known allowing determination of state of health related to resistance SOHR. According to this method, estimation requires a charge or discharge pulse i.e. specific action taken by the user. However, such action may never occur. More generally, the reliance of this method on specific action by the user limits the advantage thereof.

Typically, the state of charge SOC is determined as being the amount of energy available in the battery in relation to the energy of a fully charged battery. The state of charge SOC can be calculated for example with an algorithm using measurements of voltage, or integration of charge/discharge current as a function of time under battery current conditions. At the present time, most standard SOC computations based on continuous measurement of voltage-current-temperature data use two successively alternating computing modes.

The first or main mode is most often of coulometric type i.e. computed by integration of the charge/discharge current as a function of time. Therefore, the state of charge SOC is directly dependent on the count of ampere-hours and on battery capacity.

This first mode is highly sensitive to current measurement error and to estimation of battery capacity which itself is directly a function of the state of health SOH. Voltage drifts can occur if this mode is used alone due to inaccurate estimation of the state of charge SOC.

The second mode or calibration mode is generally based on measurement of voltage and uses a table of state of charge as a function of open circuit voltage OCV.

This second mode is highly sensitive to estimation of battery resistance itself directly related to state of health SOH. To minimize the impact of inaccurate estimation of resistance on the computing of state of charge SOC, voltage adjustment is carried out during rest periods or periods with very low current.

Inaccurate estimation of the state of health SOH of the battery therefore leads to differences in state of charge values when transitioning between the two computing modes.

There exist some solutions to mask differences in the values of state of charge SOC during transitions, but not to correct these differences.

SUMMARY OF THE INVENTION

It is therefore one of the objectives of the invention in particular to solve the aforementioned problems by proposing a method to determine at least one state of health parameter related to resistance of at least one accumulator of a battery, that is more accurate.

Said method, by providing exact information for example on state of health related to resistance SOHR of a battery, allows a substantial improvement in voltage-based computing of state of charge SOC.

In addition, it minimizes differences when computing state of charge SOC with the coulometry computing mode and when it is based on open circuit voltage OCV.

It also allows readjustment of state of charge SOC on voltage under stronger current.

In a first aspect, the invention therefore concerns a method for determining at least one first state of health parameter related to resistance of at least one accumulator of a battery.

The method comprises the steps particularly consisting of:
performing a series of measurements of N samples, with $N \geq 3$, of at least voltage, current and cumulative capacity as from the first sample (hereafter called cumulative capacity) at the terminals of said accumulator when said accumulator is charged or discharged;
creating a minimization loop by varying a current value of the first parameter of the accumulator from a determined initial value, comprising the following steps:
(i) computing N estimated values of a second parameter relating to the state of charge of the accumulator from the current value of the first parameter and respectively from said N samples;
(ii) computing N theoretical values of the second parameter;
(iii) varying the current value of the first parameter, repeating the preceding computation steps for each variation of said current value of the first parameter, and determining the value of the first parameter as being the current value of the first parameter which minimizes the difference between the estimated values and the theoretical values of the second parameter.

In some embodiments, the method further comprises one or more of the following characteristics taken alone or in any technically possible combination:
to determine the current value of the first parameter which minimizes the difference between the estimated values and the theoretical values of the second parameter, the current value of the first parameter is determined which minimizes:
either the following formula:

$$\sum_{k=1}^{N} |SOC_{k,theoretical} - SOC_k|\alpha, \text{ with } \alpha \geq 1,$$

or the following formula:

$$\sum_{k=1}^{N} |SOC_{k,theoretical} - SOC_k|\alpha / |SOC_N - SOC_1|, \text{ with } \alpha \geq 1$$

the current value of the first parameter is expressed as a percentage of the determined initial value of said first parameter;
the variation in the current value of the first parameter at each step of the minimization loop is obtained by constant increment of substantially between 1% and 50%, preferably by increment substantially equal to 5%, up to a determined maximum value;
the variation in the current value of the first parameter at each step of the minimization loop is obtained by dichotomy between the determined initial value, preferably substantially equal to 100%, and a determined maximum value, preferably substantially equal to 400%;
the variation in the current value of the first parameter at each step of the minimization loop is obtained by constant increment in absolute value, alternately positive and negative from one of said steps to another, preferably substantially equal to ±5% of the determined initial value;
to perform the series of measurements of N samples, the sampling interval is determined so that it corresponds to a constant variation of the second parameter, preferably substantially equal to 10%;
to perform the series of measurements of N samples, the sampling interval is determined so that it corresponds to a constant variation of cumulative capacity, preferably substantially equal to 0.1 A.h;
to perform the series of measurements of N samples, the sampling interval is determined so that it corresponds to a constant variation of voltage;
to perform the series of measurements of N samples, sampling is stopped as soon as Max((Ahk)−Min ((Ahk)) is higher than a threshold determined as a function of the capacity of the accumulator;
the determined threshold is higher than or equal to, for example equal to, 9% of the capacity at a given instant in time;
the determined threshold is substantially equal to one fifth of the original capacity of the accumulator;
the estimated values of state of charge are determined from a look-up table with open circuit voltage values, these said open circuit voltage values being computed from the current value of state of health related to resistance and respectively from the N samples;
the open circuit voltage values are obtained by computing $OCV_k = V_k - R_{step} \times I_k$, with $I_k > 0$ charge, $OCV_k$ being the $k^{th}$ open circuit voltage value, $V_k$ being the $k^{th}$ voltage value, $I_k$ being the $k^{th}$ current intensity value and $R_{step}$ being the current resistance value obtained by computing $R_{step} = SOHR_{step} \times R_{BOL}$, $SOHR_{step}$ being the current value of state of health related to resistance and $R_{BOL}$ being the original resistance value of the accumulator;
the original resistance value of the accumulator is a scalar value;
when performing the series of measurements of N samples, the temperature of the accumulator is measured for each sample, and the original resistance of the accumulator is obtained from a look-up table according to the measured temperature;

the first state of health parameter related to resistance of the accumulator is the resistance of said accumulator, or the state of health related to resistance, said resistance and said state of health related to resistance being related by the equation $R_{n+1} = SOHR_{n+1} \times R_{BOL}$, $R_{BOL}$ being the original resistance at the terminals of the accumulator;

the theoretical values of state of charge are obtained by computing $a \times Ah_k + b$, $Ah_k$ being the $k^{th}$ cumulative capacity value, and a and b being two coefficients which, for the current value of the first parameter in the minimization loop, minimize;

either the following formula:

$$\sum_{k=1}^{N} |SOC_{k,theoretical} - SOC_k|\alpha, \text{ with } \alpha \geq 1,$$

or the following formula:

$$\sum_{k=1}^{N} |SOC_{k,theoretical} - SOC_k|\alpha / |SOC_N - SOC_1|, \text{ avec } \alpha \geq 1.$$

the theoretical values of state of charge are obtained by computing $a \times X_k + b$, $X_k$ being equal to the difference between the $k^{th}$ cumulative capacity value and the first cumulative capacity value, a being equal to $(SOC_N - SOC_1)/X_N$, and b being equal to $SOC_1$, $SOC_1$ and $SOC_N$ respectively being the first and the $N^{th}$ estimated value of state of charge, $X_N$ being equal to the difference between the $N^{th}$ cumulative capacity value and the first cumulative capacity value;

a third parameter is determined related to the state of the accumulator which is the state of health related to the capacity of the accumulator, and the value of the state of health related to capacity is determined as being equal to the value of the last coefficient a determined in the minimization loop divided by the original value of coefficient a.

In another aspect, a further subject of the invention is a method for determining several first parameters relating to the respective states of a plurality of accumulators connected in series and/or in parallel in a battery, each of the first parameters being determined with the method such as described in the foregoing.

In another aspect a further subject of the invention is a method for determining several first parameters relating to the respective state of a plurality of accumulators, said plurality of accumulators being distributed over several modules comprising one or more of said accumulators, said modules being connected in series and/or in parallel in a battery, each of the first parameters being determined with the method according to the first aspect of the invention described above.

Optionally, in the method of the first aspect of the invention described above, the accumulator is a battery, itself comprising one or more accumulators, and the series of measurements of the N samples being performed at the terminals of the battery.

In a still further aspect, the subject of the invention is an electronic management system for a battery having at least one accumulator, the system comprising means for measuring samples of at least voltage, current and cumulative capacity at the terminals of said accumulator when said accumulator is charged or discharged, and a microprocessor programmed to implement the method according to one and/or the other of the preceding aspects of the invention described above.

A further subject of the invention in another aspect is a battery comprising at least one electrochemical accumulator, and at least one electronic management system such as described above.

A further subject of the invention in a further aspect is a battery comprising a plurality of electrochemical accumulators arranged in modules and/or connected in series and/or in parallel, and at least one electronic management system such as described above.

With the invention it is therefore possible in particular to determine the state of health of a battery related to resistance and the state of health related to capacity.

Determination of state of health related to resistance does not require any pulse or variation in current.

Determination of state of health related to resistance and state of health related to capacity is performed simultaneously.

In addition, determination of state of health related to resistance and state of health related to capacity only requires 9% of Depth of Discharge (DOD).

DRAWINGS

Figure 2:
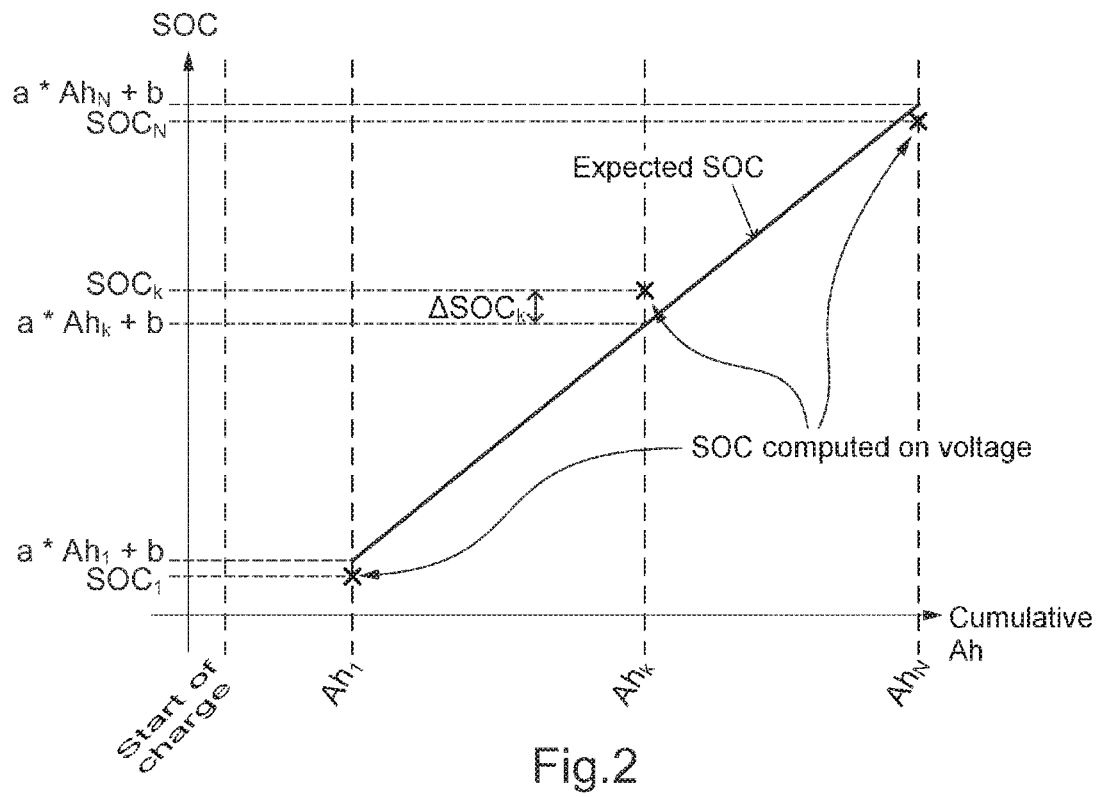
Figure 3:
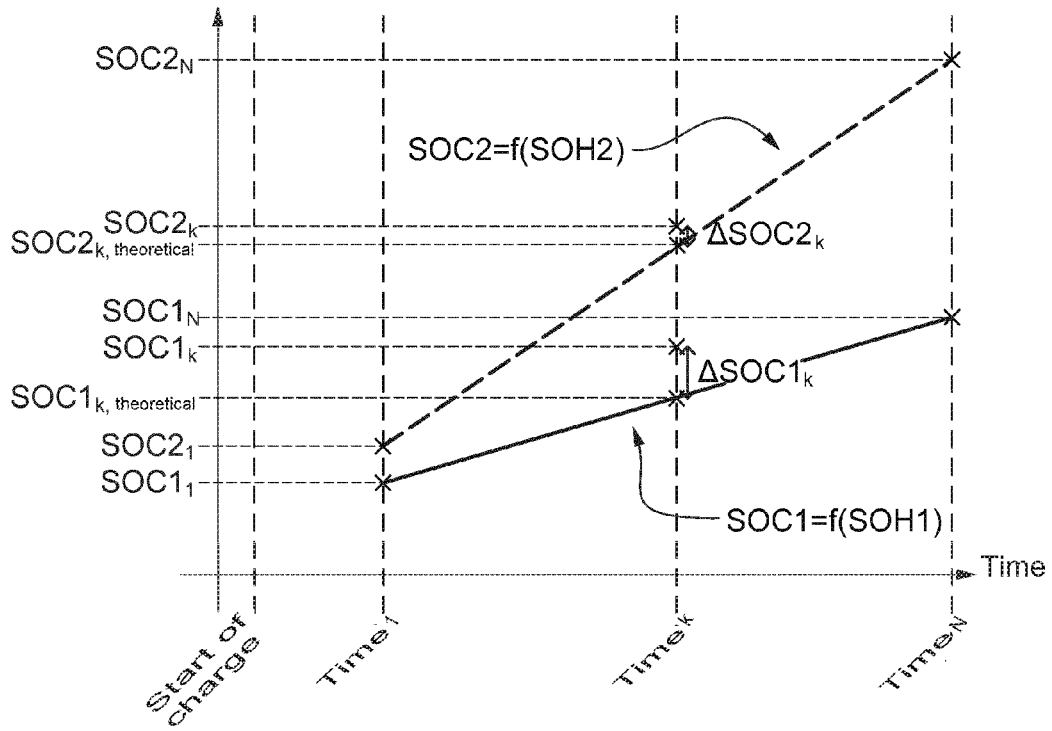
Figure 4:
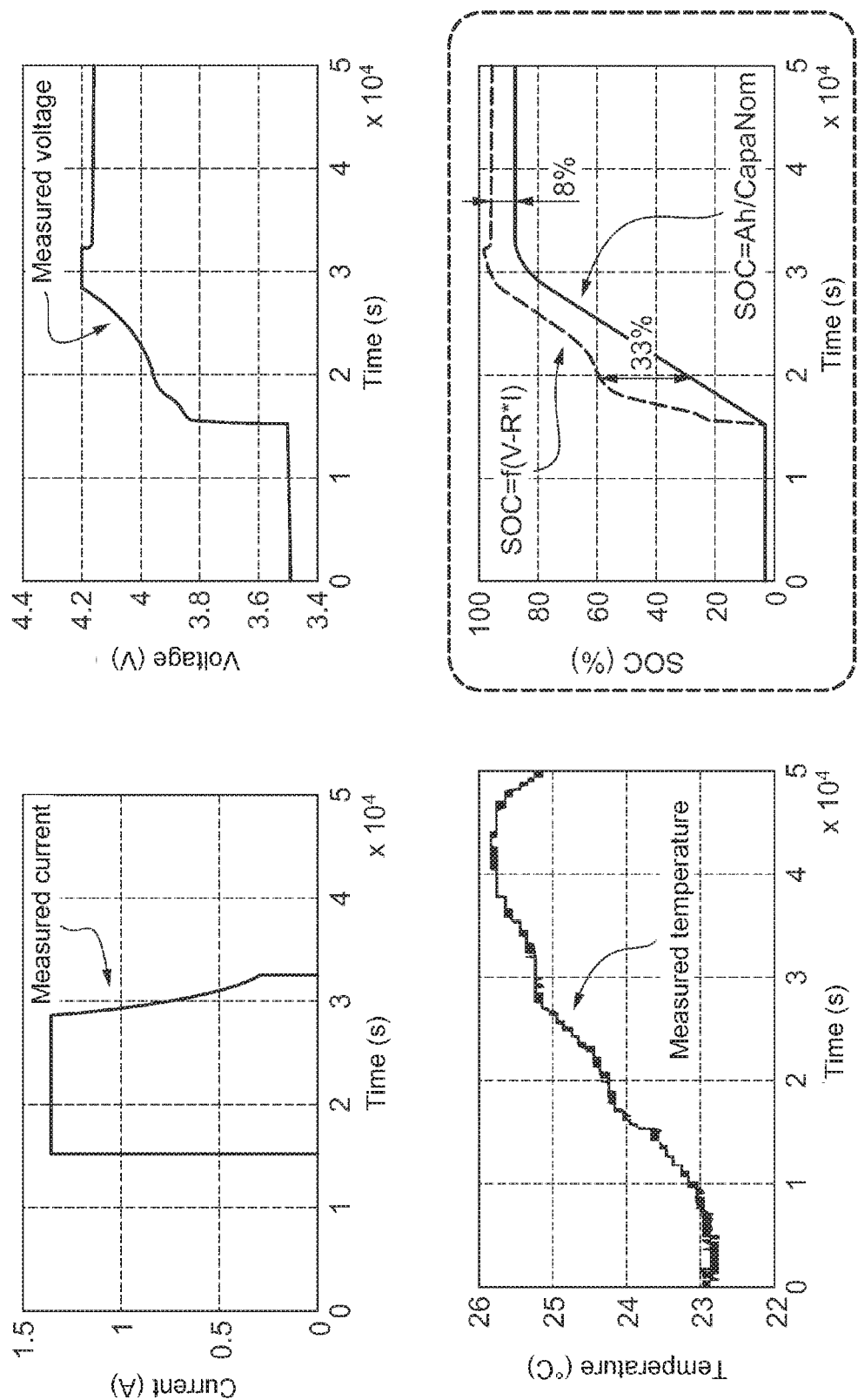
Figure 5:
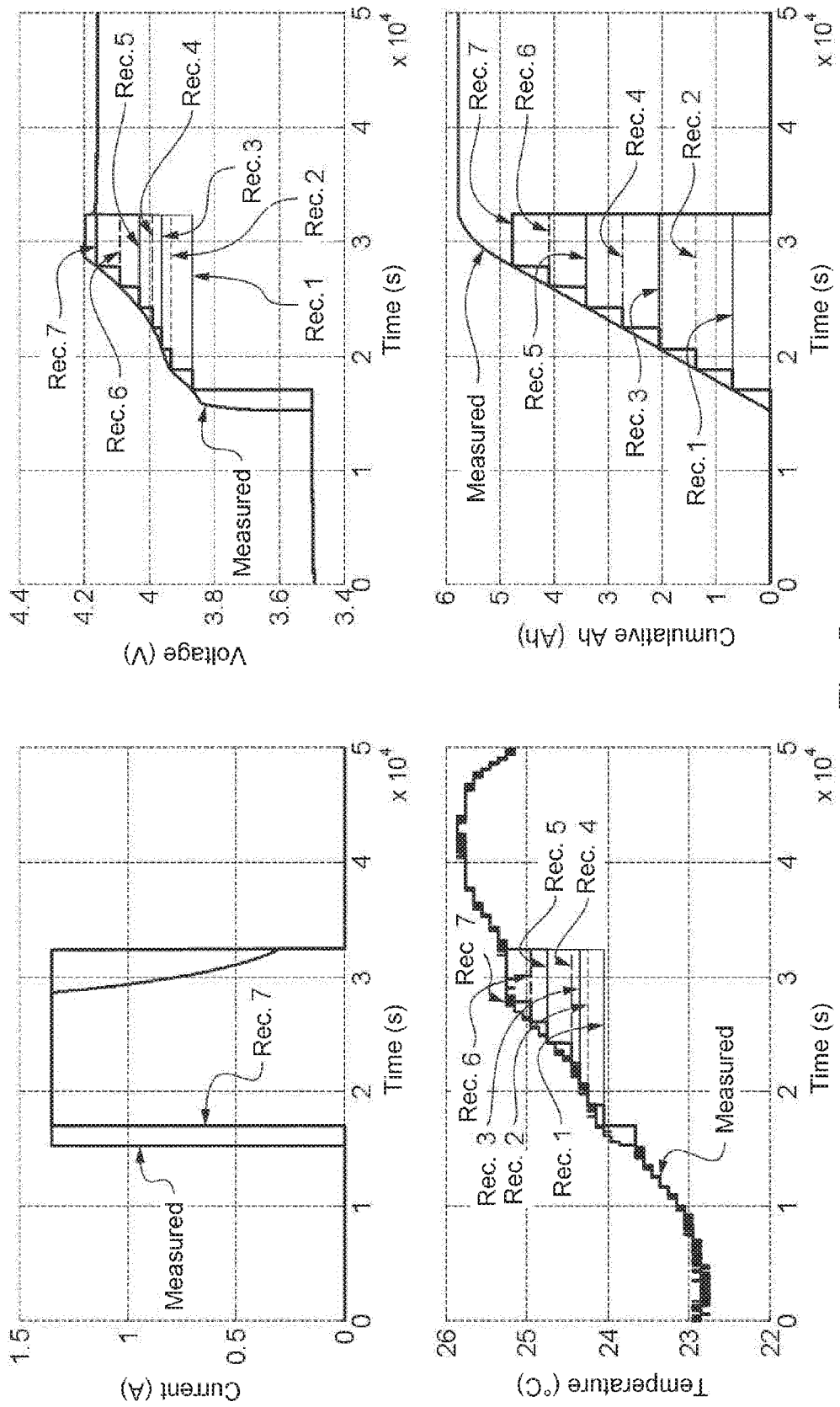
Figure 6:
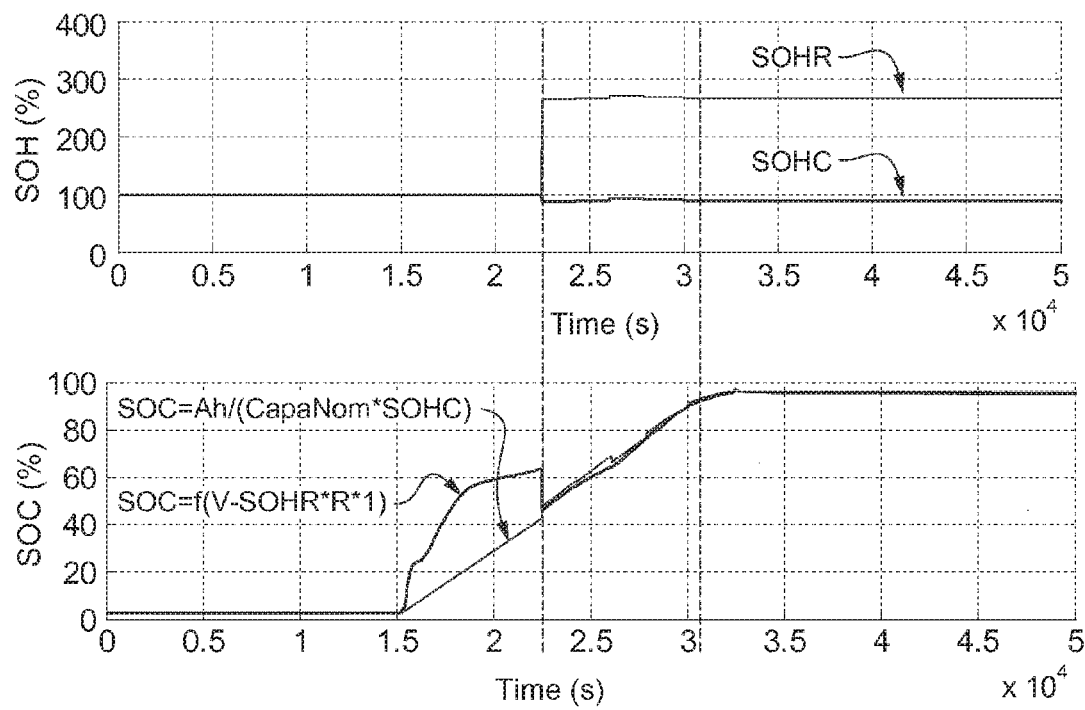
Figure 7:
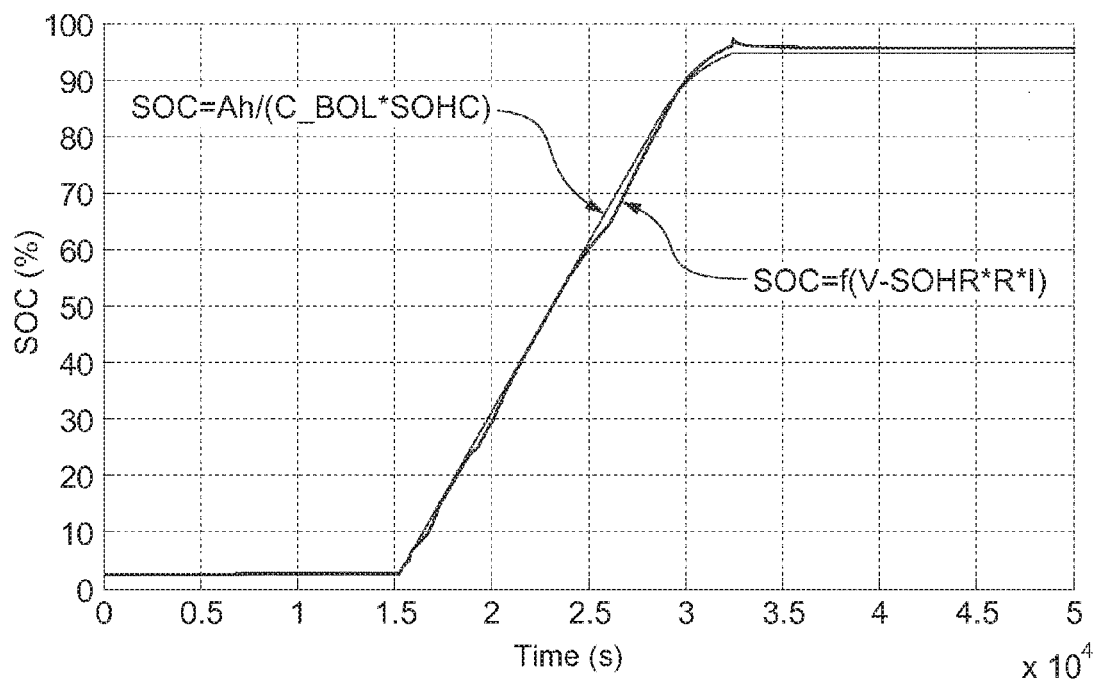

The characteristics and advantages of the invention will become apparent on reading the following nonlimiting description given as an example with reference to the following Figures:

FIG. 1: schematic illustration of the method of the invention:

FIG. 2: graph illustrating computation of the estimated values of the second state of charge parameter SOC, and the difference in relation to the theoretical values of this second parameter, in a first variant of embodiment of the method;

FIG. 3: graph illustrating computation of the estimated values of the second state of charge parameter SOC, and the difference in relation to the theoretical values of this second parameter, in a second variant of embodiment of the method illustrating two steps defined by two separate values of the first SOHR parameter;

FIG. 4: graphs illustrating experimental results of computation of the second state of charge parameter SOC, according to two prior art methods without using the method of the invention:

FIG. 5: graphs illustrating experimental results of the recording of sample values of current, voltage, temperature and capacity, used in the method of the invention;

FIG. 6: graphs illustrating experimental results of computation of the first state of health parameter SOH and second SOC parameter relating to state of charge, from samples having the values given in FIG. 5, and from earlier highly inaccurate SOH values;

FIG. 7: graph illustrating experimental results of computation of the second state of charge parameter SOC from samples having the values given in FIG. 5, and from earlier SOH values obtained during the test illustrated in FIG. 6.

DETAILED DESCRIPTION

The method of the invention such as presented above and described below in more detail for particular embodiments, can be implemented in an electronic management system for a battery comprising means to measure a current delivered by at least one accumulator of the battery (the measured current allowing calculation of the cumulative capacity at the terminals of the accumulator), means to measure the voltage at the terminals of said at least one accumulator and means to measure the temperature of the accumulator, and a microprocessor programmed to perform the steps described in detail below.

The following description is given for one accumulator of a battery. It is to be understood however that this same description could similarly apply to a module of a battery, said module comprising a plurality of accumulators connected in series and/or in parallel in manner known per se. Similarly, the same description could apply to the battery itself. The decision to determine the parameter(s) relating to the state of health of the battery, of each module or of each accumulator is dependent on the application and type of battery. The electronic management system implementing the method of the invention can also be reprogrammed if needed according to the presence of adequate measuring means in the battery.

FIG. 1 schematically illustrates the method of the invention for determining a first state of health parameter relating to resistance of an accumulator of a battery. This parameter can be the resistance R itself or the state of health related to resistance SOHR using the formula: $R=SOHR \times R_{BOL}$, where $R_{BOL}$ is the original resistance. In other words, SOHR is defined as the ratio between the resistance at a given instant in time and the original resistance. This SOHR parameter can therefore be expressed as a percentage of the original resistance value.

It is assumed here that the first parameter has already been determined preferably by previously implementing the method of the invention, otherwise any other method. The value of this first previously determined parameter is designated $SOHR_n$, $R_n$, and the method of the invention is described below for determining the following value of this first parameter designated $SOHR_{n+1}$, $R_{n+1}$.

At step 10, several samples of respective voltage $V_k$, current $I_k$ and cumulative capacity $Ah_k$ values, at the terminals of the accumulator, are measured when this accumulator is charged or discharged and are recorded by the previously mentioned electronic management system.

Depending on embodiments, it is also possible at this step 10 to measure other values such as temperature values $T_k$ of the accumulator.

Preferably, the number N of samples, $I_k$, $Ah_k$ (and optionally $T_k$) is 3 or higher.

The sampling interval for performing the series of N sample measurements $V_k$, $I_k$, $A_k$ (and optionally $T_k$) can be determined in different manners.

This sampling interval can particularly be determined so that it corresponds to a constant variation in the state of charge parameter SOC of the accumulator computed at each sampling interval. Preferably, this constant variation is substantially equal to 10%. In other words, sampling is performed every 10% rise or fall of the state of charge SOC, or when $\Delta SOC=|SOC_{k-1}-SOC_k|=10\%$.

Alternatively, this sampling interval can be determined so that it corresponds to a constant variation in cumulative capacity Ah. Preferably, this constant variation is substantially equal to 0.1 A.h. In other words, sampling is performed every 0.1 A.h fall or rise in cumulative capacity Ah. or when $\Delta Ah=|Ah_{k-1}-Ah_k|=0.1$ A.h.

In another alternative, this sampling interval can be determined so that it corresponds to a constant variation in voltage $V_k$. In other words, sampling is performed every x V rise or fall in voltage V, or when $\Delta V=|V_{k-1}-V_k|=x$ V, x being a determined value.

At step 20, it is determined whether a determined end-of-sampling criterion is met. This step is implemented after each sample measurement k allowing the values $V_k$, $T_k$, $Ah_k$ to be obtained (and optionally $T_k$). If the criterion is met, a loop is started at step 30 which will allow the value of the first parameter $SOHR_{n+1}$, $R_{n+1}$ to be estimated. Otherwise, it is returned to step 10 to conduct a new sample measurement k+1 which will allow obtaining of the values $V_{k+1}$, $I_{k+1}$, $Ah_{k+1}$ (and optionally $T_{k+1}$).

It is therefore this criterion which determines the number N of samples $V_k$, $I_k$, $Ah_k$ (and optionally $T_k$) that are measured and recorded.

It is possible for example to stop sampling as soon as $Max((Ah_k)-Min((Ah_k))$ is higher than a determined threshold which is dependent on original capacity, denoted Capa_BOL_CEI, of the accumulator.

In one variant, this determined threshold is substantially equal to 9% of the original capacity Capa_BOL_CEI of the accumulator. In other words, in this variant sampling is stopped when $Max((Ah_k)-Min((Ah_k))>0.09 \times$Capa_BOL_CEI.

Alternatively, this determined threshold can be substantially equal to 9% of the capacity at a given instant in time.

In another variant, this determined threshold is substantially equal to one fifth of the original capacity Capa_BOL_CEI of the accumulator. In other words, in this variant sampling is stopped when $Max((Ah_k)-Min((Ah_k))>$Capa_BOL_CEI/5.

At step 30, the minimization loop which will allow estimation of the value of the first parameter $SOHR_{n+1}$, $R_{n+1}$ is initialized. The value estimated at the last $SOHR_n$, $R_n$ update is then assigned to the current value of the first parameter $SOHR_{step}$, $R_{step}$.

A series of steps 40, 50, 60 is then repeated in a loop until the estimation of the value of the first parameter $SOHR_{n+1}$, $R_{n+1}$ is obtained concerning the state of health related to resistance.

Therefore, at step 40. N estimated $SOC_k$ values are computed of the second state of charge parameter SOC of the accumulator from the current value of the first parameter $SOHR_{step}$, $R_{step}$ and respectively from the N samples $V_k$, $I_k$, $Ah_k$.

For this computation, a look-up table is used matching open circuit voltage values $OCV_k$ with estimated values of the second parameter $SOC_k$.

The open circuit voltage values $OCV_k$ are computed from the current value of state of health related to resistance $SOHR_{step}$, $R_{step}$ and respectively from the N samples $V_k$, $I_k$, $A_k$.

More specifically, the open circuit voltage values $OCV_k$ are obtained by computing: $OCV_k=V_k-R_{step} \times I_k$.

For this calculation, $OCV_k$ is therefore the $k^{th}$ open circuit voltage value, $V_k$ is the $k^{th}$ voltage value, $I_k$ is the $k^{th}$ current intensity value and $R_{step}$ is the current value of resistance obtained by computing $R_{step}=SOHR_{step} \times R_{BOL}$, $SOHR_{step}$ being the current value of state of health related to resistance and $R_{BOL}$ being the original resistance value of the accumulator.

The original resistance value $R_{BOL}$ of the accumulator can be a determined scalar value.

Alternatively, the value of the original resistance value $R_{BOL}$ of the accumulator is obtained from a look-up table as a function of the temperature $T_k$ measured at step 10, or as a function of the estimated $SOC_k$ values of the second state of charge parameter SOC.

At step 50, the N theoretical values $SOC_{k,theoretical}$ are computed of the second SOC parameter.

Embodiments of step 50 are explained in detail later in the present description.

At step 60, the difference is determined between the estimated $SOC_k$ values and the theoretical $SOC_{k,theoretical}$ values of the second parameter as is explained further on in the description.

Steps 40 to 60 are then repeated by incrementing the current value of the first parameter $SOHR_{step}$, $R_{step}$ at step 80, up until an end-of-estimation criterion is met, this criterion being tested at step 70.

Therefore, if the criterion tested at step 70 is not met, the current value of the first parameter $SOHR_{step}$, $R_{step}$ is varied at step 80, and steps 40 to 70 are repeated. If on the other hand the criterion tested at step 70 is met, it is emerged from the convergence loop and, at step 90, the value of the first parameter $SOHR_{n+1}$, $R_{n+1}$ is determined as being the current value of the first parameter $SOHR_{step}$, $R_{step}$ which allows the criterion tested at step 70 to be met.

This criterion tested at step 70 is minimization of the difference between the estimated $SOC_k$ values and the theoretical $SOC_{k,theoretical}$ values of the second parameter.

To measure the difference between the estimated $SOC_k$ values and the theoretical $SOC_{k,theoretical}$ values of the second parameter, performed at step 60, either one of the following formulas are used:

$$\sum_{k=1}^{N} |SOC_{k,theoretical} - SOC_k|\alpha, \text{ with } \alpha \geq 1,$$

$$\sum_{k=1}^{N} |SOC_{k,theoretical} - SOC_k|\alpha / |SOC_N - SOC_1|, \text{ with } \alpha \geq 1.$$

Therefore, the value of the first parameter $SOHR_{n+1}$, $R_{n+1}$ is determined as being the current value of this first parameter $SOHR_{step}$, $R_{step}$ which minimizes the difference between the estimated $SOC_k$ values and the theoretical $SOC_{k,theoretical}$ values of the second parameter computed using either one of the above formulas.

To vary or increment the current value of the first parameter $SOHR_{step}$, $R_{step}$ at step 80, it is possible at each step of the minimization loop to use a constant increment. If the focus is on the state of health parameter related to resistance $SOHR_{step}$ for example, a constant incremental value of substantially between 1% and 50% can be chosen. In one preferred embodiment, this increment is substantially equal to 5%. Variation or incrementation is limited to a determined maximum value of $SOHR_{step}$.

Another manner in which to vary or increment the current value of the first parameter $SOHR_{step}$, $R_{step}$ at step 80 is to proceed by dichotomy at each step of the minimization loop between the determined initial value $SOHR_n$, $R_n$ and a determined maximum value.

Preferably, the determined initial value is substantially equal to 100%. Also preferably, the determined maximum value is substantially equal to 400%.

A still further manner in which to vary or increment the current value of the first parameter $SOHR_{step}$, $R_{step}$ at step 80 is to increment constantly in absolute value, at each step of the minimization loop, with an alternate positive and negative increment relative to the first value of $R_{step}$. This increment is then preferably substantially equal to ±5% of the determined initial value $SOHR_n$, $R_n$.

As indicated above, the theoretical values of the $SOC_{k,theoretical}$ state of charge computed at step 50, can be obtained by computing according to several embodiments.

In a first embodiment, these theoretical values of state of charge $SOC_{k,theoretical}$ are obtained by computing $a \times Ah_k + b$, where a and b are two coefficients which, for the current value of the first parameter $SOHR_{step}$, $R_{step}$ in the minimization loop, minimize one or other of the following formulas:

$$\sum_{k=1}^{N} |SOC_{k,theoretical} - SOC_k|\alpha, \text{ avec } \alpha \geq 1,$$

$$\sum_{k=1}^{N} |SOC_{k,theoretical} - SOC_k|\alpha / |SOC_N - SOC_1|, \text{ avec } \alpha \geq 1.$$

FIG. 2 shows a graph illustrating the computing of the estimated values of the second state of charge parameter SOC, and the difference in relation to the theoretical values of this second parameter, in this first embodiment.

The theoretical values of state of charge $SOC_{k,theoretical}$ represent an expected linear as a function of the capacity values in $Ah_k$.

In a second embodiment, these theoretical state of charge values $SOC_{k,theoretical}$ are obtained by computing $a \times X_k + b$.

In this computation, $X_k$ is equal to the difference between the $k^{th}$ cumulative capacity value and the first cumulative capacity value, a is equal to $(SOC_N - SOC_1)/X_N$ and b is equal to $SOC_1$ ($SOC_1$ and $SOC_N$ respectively being the first and the $N^{th}$ estimated state of charge value), and $X_N$ being equal to the difference between the $N^{th}$ cumulative capacity value and the first cumulative capacity value.

FIG. 3 shows a graph illustrating the computing of the estimated values of the second state of charge parameter SOC, and the difference in relation to the theoretical values of this second parameter, in this second embodiment.

In this graph, it can be seen that the time values along the X-axis $Time_k$ are equal to $Ah_k/I_k$ if $I_k$ is constant (within the same sampling mode).

In either one of these embodiments, the value of a third parameter relating to the state of health of the accumulator is also determined at step 90, the state of health related to capacity $SOHC_{n+1}$, being equal to the value of the last coefficient a determined in the minimization loop divided by the original value of coefficient a denoted $a_{BOL}$.

The above-described method can be used to determine several first parameters $SOHR_{n+1}$, $R_{n+1}$ relating to the respective states of a plurality of accumulators connected in series and/or in parallel in a battery.

This method can also be used to determine several first parameters $SOHR_{n+1}$, $R_{n+1}$ relating to the respective states of a plurality of accumulators, this plurality of accumulators being distributed over several modules comprising one or more accumulators, these modules being connected in series and/or in parallel in a battery.

This method can further be used to determine a first parameter $SOHR_{n+1}$, $R_{n+1}$ relating to the state of a battery considered to be a primary accumulator comprising one or more secondary accumulators.

Therefore, in addition to providing additional, accurate information on the state of health SOH of the battery, the invention allows a substantial improvement in the computing of state of charge SOC by obviating differences and providing accuracy close to a perfect coulometric measurement.

In addition, the invention applies to any battery system of general configuration xs*yp. As already explained, for reasons of simplification the present description describes one element or accumulator. If a battery contains several elements, the invention can be applied to each element individually, or using global characteristic values of the battery such as:

Temperature: minimum temperature, or maximum temperature, or mean temperature over all the elements of the battery;

Voltage: mean voltage ($V=V_{battery}/x$), or minimum voltage over all the elements of the battery;

Current: mean current ($I=I_{battery}/y$).

The method was experimentally implemented on a SAFT MP176065 accumulator element, corresponding to a C5 charge rate and at ambient temperature on an aged element.

In this experiment, the set current corresponded to C5 charging of an element having a capacity of 6.8 Ah. i.e. 1.36 A delivered current with "floating" when the voltage reached 4.2V.

The temperature and voltage of the element were also measured.

FIG. 4 shows graphs illustrating experimental computation results of the second state of charge parameter SOC, using two prior art methods without applying the method of the invention for comparison.

More specifically, from left to right and from top to bottom FIG. 4 illustrates current measurement, voltage measurement, temperature measurement and calculation of the values of the state of charge parameter SOC.

The graph surrounded by a dotted line illustrates this computation of the values of the state of charge parameter SOC:

with a so-called «voltage» method, without taking into consideration the state of health related to resistance SOHR: upper curve corresponding to the values of the state of charge SOC as a function of open circuit voltage OCV, with OCV=Voltage−Initial resistance×Current;

with a so-called «coulometric» method without taking into consideration the state of health related to capacity SOHC: lower curve corresponding to the ratio between capacity Ah and the initial capacity CapaNom.

Computing of the state of charge SOC based on voltage without taking into consideration the state of health related to resistance SOHR does not allow guaranteeing of battery capacity. In addition, its non-linear profile is not satisfactory since it does not correspond to the expected.

Computing of the state of charge SOC based on capacity (counting of ampere-hours) without taking into consideration the state of health related to capacity SOHC is inaccurate. Under zero current after relaxation for a few hundred seconds, the state of charge SOC is given by the voltage of the element, which is identical to the open circuit voltage OCV. A difference is seen here, after completion of the test, between the state of charge SOC based on capacity and the exact state of charge based on voltage.

Realignment on voltage with low current would entail a difference in state of charge SOC here of 8%, which is not acceptable.

Realignment on voltage under current would entail a difference in the state of charge SOC here of 33%, which is not acceptable either.

FIG. 5 shows graphs illustrating the experimental results of recorded sample values of current, voltage, temperature and capacity used in the method of the invention.

More specifically, from left to right and from top to bottom it gives:

the recording of current samples;
the recording of voltage samples;
the recording of temperature samples;
the recording of cumulative capacity samples.

In this example, sampling is conducted for delta measurement points of constant capacity Ah, equal to 6.8 A.h/10.

FIG. 6 shows graphs illustrating experimental computing results of the first state of health parameter SOH, related to resistance (SOHR) and related to capacity (SOHC), and of the second state of charge parameter SOC, from the sample values given in FIG. 5 and from earlier highly inaccurate SOH values.

This time, to compute the value of state of charge SOC, the SOH was taken into consideration. Therefore, in the first graph in FIG. 6:

with the so-called «voltage» method, taking into consideration the state of health related to resistance SOHR: upper curve corresponding to the values of state of charge SOC as a function of open circuit voltage OCV, with OCV=Voltage−Initial resistance×SOHR×Current;

with the so-called, «coulometric» method taking into consideration the state of health related to capacity SOHC: lower curve corresponding to capacity Ah relative to initial capacity CapaNom multiplied by SOHC.

The updating of state of health SOH is performed here after recording 4 samples (N=4), which corresponds to a period of time having a duration of about 22500 s in the graphs in FIG. 6.

The variation in state of health related to resistance SOHR and state of health related to capacity SOHC, and hence the error in respect of this state of health (SOHR or SOHC), does not exceed 5%.

The computed values of state of health SOHR and SOHC are maintained for computing the following states of charge SOC, up until the next update, when the conditions for implementing the method are met.

FIG. 7 shows a graph illustrating experimental computing results of the second state of charge parameter SOC, from the sample values given in FIG. 5, and from SOH values obtained at the test illustrated in FIG. 6, according to embodiments of the method of the invention.

More specifically, the difference between the state of charge SOC based on voltage taking into consideration state of health related to resistance SOHR (upper curve) and state of charge SOC based on cumulative capacity (counting of ampere-hours) taking into consideration state of health related to capacity SOHC (lower curve), is less than 3%.

Therefore, determination of state of charge based on voltage taking into consideration state of health related to resistance allows guaranteeing of battery capacity. In addition, it is of linear profile as theoretically expected.

The present invention is evidently not limited to the embodiments described in the foregoing as examples. The tests provided to validate the method of the invention are only given for exemplary purposes.

In addition, the method of the invention can be applied in particular to batteries composed of any type of electrochemical accumulators. Also, the number of accumulators connected in series and/or in parallel may vary without substantially modifying the implementation of the method of the invention.

The invention claimed is:

1. Method for determining the value of at least one first state of health parameter related to resistance ($SOHR_{n+1}$, $R_{n+1}$) of at least one accumulator of a battery, by means of an electronic management system comprising means for measuring samples ($V_k$, $I_k$, $A_k$) of at least voltage ($V_k$), current ($I_k$) and cumulative capacity ($A_k$), at the terminals of said at least one accumulator when said at least one accumulator is charged or discharged and a microprocessor, the method comprising the steps consisting in particular of:

performing by said means for measuring a series of measurements of N samples ($V_k$, $I_k$, $Ah_k$), with N≥3, of at least voltage ($V_k$), current ($I_k$) and cumulative capacity ($Ah_k$), at the terminals of said at least one accumulator, when said at least one accumulator is charged or discharged;

creating a minimization loop by varying a current value of the first parameter ($SOHR_{step}$, $R_{step}$) of the at least one accumulator from a determined initial value ($SOHR_n$, $R_n$), comprising the following steps:

(i) computing by said microprocessor N estimated values of a second parameter ($SOC_k$) relating to the state of charge of the at least one accumulator from the current value of the first parameter ($SOHR_{step}$, $R_{step}$) and respectively from said N samples ($V_k$, $I_k$, $Ah_k$);

(ii) computing by said microprocessor N theoretical values of the second parameter ($SOC_{k,theoretical}$);

(iii) varying by said microprocessor the current value of the first parameter ($SOHR_{step}$, $R_{step}$), repeating the preceding computation steps for each variation of said current value of the first parameter ($SOHR_{step}$, $R_{step}$), and determining by said microprocessor the value of the first parameter ($SOHR_{n+1}$, $R_{n+1}$) as being the current value of the first parameter ($SOHR_{step}$, $R_{step}$) which minimizes the difference between the estimated values ($SOC_k$) and the theoretical values ($SOC_{k,theoretical}$) of the second parameter.

2. The method according to claim 1, wherein to determine the current value of the first parameter ($SOHR_{step}$, $R_{step}$) which minimizes the difference between the estimated values ($SOC_k$) and the theoretical values ($SOC_{k,theoretical}$) of the second parameter, the current value of the first parameter ($SOHR_{step}$, $R_{step}$) is determined which minimizes:

either the following formula:

$$\sum_{k=1}^{N} |SOC_{k,theoretical} - SOC_k|\alpha, \text{ with } \alpha \geq 1,$$

or the following formula:

$$\sum_{k=1}^{N} |SOC_{k,theoretical} - SOC_k|\alpha/|SOC_N - SOC_1|, \text{ with } \alpha \geq 1.$$

3. The method according to claim 1, wherein the current value of the first parameter ($SOHR_{step}$, $R_{step}$) is expressed as a percentage of the determined initial value of said first parameter ($SOHR_n$, $R_n$).

4. The method according to claim 3, wherein the variation in the current value of the first parameter ($SOHR_{step}$, $R_{step}$) at each step of the minimization loop is obtained by constant increment of substantially between 1% and 50%, up to a determined maximum value.

5. The method according to claim 4, wherein the constant increment is substantially equal to 5%.

6. The method according to claim 3, wherein the variation in the current value of the first parameter ($SOHR_{step}$, $R_{step}$) at each step of the minimization loop is obtained by dichotomy between the determined initial value ($SOHR_n$, $R_n$), and a determined maximum value.

7. The method according to claim 6, wherein the determined initial value ($SOHR_n$, $R_n$) is substantially equal to 100%.

8. The method according to claim 6, wherein the determined maximum value is substantially equal to 400%.

9. The method according to claim 6, wherein the variation in the current value of the first parameter ($SOHR_{step}$, $R_{step}$) at each step of the minimization loop is obtained by constant increment in absolute value, alternately positive and negative from one of said steps to another.

10. The method according to claim 9, wherein the constant increment is substantially equal to ±5% of the determined initial value ($SOHR_n$, $R_n$).

11. The method according to claim 1, wherein to perform the series of measurements of N samples ($V_k$, $I_k$, $A_k$), the sampling interval is determined so that it corresponds to a constant variation of the second parameter ($SOC_k$).

12. The method according to claim 11, wherein the constant variation is substantially equal to 10%.

13. The method according to claim 1, wherein when performing the series of measurements of N samples ($V_k$, $I_k$, $A_k$), the sampling interval is determined so that it corresponds to a constant variation of cumulative capacity ($Ah_k$).

14. Method according to claim 13, wherein the constant variation is substantially equal to 0.1 A.h.

15. The method according to claim 1, wherein to perform the series of measurements of N samples ($V_k$, $I_k$, $A_k$), the sampling interval is determined so that it corresponds to a constant variation of voltage ($V_k$).

16. The method according to claim 1, wherein when performing the series of measurements of N samples ($V_k$, $I_k$, $A_k$), sampling is stopped as soon as $Max((Ah_k)-Min((Ah_k))$ is higher than a threshold determined as a function of the capacity of the accumulator.

17. The method according to claim 16, wherein the determined threshold is substantially higher than or equal to 9% of the original capacity (Capa_BOL_CEI), or of the capacity at a given instant in time of the accumulator.

18. The method according to claim 17, wherein the determined threshold is substantially equal to 9% of the original capacity (Capa_BOL_CEI), or of the capacity at a given instant in time of the accumulator.

19. The method according to claim 16, wherein the determined threshold is substantially equal to one fifth of the original capacity (Capa_BOL_CEI) of the accumulator.

20. The method according to claim 1, wherein the estimated values of state of charge ($SOC_k$) are determined from a look-up table with open circuit voltage values ($OCV_k$), these said open circuit voltage values ($OCV_k$) being computed from the current value of state of health related to resistance ($SOHR_{step}$, $R_{step}$) and respectively from the N samples ($V_k$, $I_k$, $A_k$).

21. The method according to claim 20, wherein the open circuit voltage values ($OCV_k$) are obtained by computing $OCV_k = V_k - R_{step} \times I_k$, with $I_k > 0$ charge, $OCV_k$ being the $k^{the}$ open circuit voltage value, $V_k$ being the $k^{th}$ voltage value, $I_k$ being the $k^{th}$ current intensity value and $R_{step}$ being the current resistance value obtained by computing $R_{step}=SOHR_{step} \times R_{BOL}$, $SOHR_{step}$ being the current value of state of health related to resistance and $R_{BOL}$ being the original resistance value of the accumulator.

22. The method according to claim 21, wherein the original resistance value $R_{BOL}$ of the accumulator is a scalar value.

23. The method according to claim 21, wherein when performing the series of measurements of N samples ($V_k$, $I_k$, $A_k$), the temperature ($T_k$) of the accumulator is measured for each sample, and in that the original resistance $R_{BOL}$ of the accumulator is obtained from a look-up table according to the measured temperature ($T_k$).

24. The method according to claim to 1, wherein the first state of health parameter related to resistance ($SOHR_{n+1}$, $R_{n+1}$) of the accumulator is the resistance ($R_{n+1}$) of said accumulator, or the state of health related to resistance ($SOHR_{n+1}$), said resistance ($R_{n-1}$) and said state of health related to resistance ($SOHR_{n+1}$) being related by the equation $R_{n+1}=SOHR_{n+1} \times R_{BOL}$, $R_{BOL}$ being the original resistance at the terminals of the accumulator.

25. The method according to claim 1, wherein the theoretical values of state of charge ($SOC_{k,theoretical}$) are obtained by computing $a \times Ah_k+b$, $Ah_k$ being the $k^{th}$ cumulative capacity value, and a and b being two coefficients which, for the current value of the first parameter ($SOHR_{step}$, $R_{step}$) in the minimization loop, minimize:

either the following formula:

$$\sum_{k=1}^{N} |SOC_{k,theoretical} - SOC_k|\alpha, \text{ avec } \alpha \geq 1,$$

or the following formula:

$$\sum_{k=1}^{N} |SOC_{k,theoretical} - SOC_k|\alpha / |SOC_N - SOC_1|, \text{ with } \alpha \geq 1.$$

26. The method according to claim 25, wherein a third parameter ($SOHC_{n+1}$) is determined related to the state of the accumulator, state of health related to the capacity ($SOHC_{n+1}$) of the accumulator, wherein the value of state of health related to capacity ($SOHC_{n+1}$) is determined as being equal to the value of the last coefficient a determined in the minimization loop divided by the original value of coefficient a.

27. The method according claim 1, wherein the theoretical values of state of charge ($SOC_{k,theoretical}$) are obtained by computing $a \times X_k+b$, $X_k$ being equal to the difference between the $k^{th}$ cumulative capacity value and the first cumulative capacity value, a being equal to $(SOC_N-SOC_1)/X_N$ and b being equal to $SOC_1$, $SOC_1$ and $SOC_N$ respectively being the first and the $N^{th}$ estimated value of state of charge, $X_N$ being equal to the difference between the $N^{th}$ cumulative capacity value and the first cumulative capacity value.

28. A method for determining several first parameters ($SOHR_{n+1}$, $R_{n+1}$) relating to the respective states of a plurality of accumulators connected in series and/or in parallel in a battery, wherein each of the first parameters is determined with the method according to claims 1.

29. A method for determining several first parameters ($SOHR_{n+1}$, $R_{n+1}$) relating to the respective states of a plurality of accumulators, said plurality of accumulators being distributed over several modules comprising one or more of said accumulators, said modules being connected in series and/or in parallel in a battery, wherein each of the first parameters is determined with the method according to claim 1.

30. The method according to claim 1, wherein the accumulator is a battery, itself comprising one or more accumulators, the series of measurements of N samples ($V_k$, $I_k$, $A_k$) being performed at the terminals of the battery.

31. An electronic management system for a battery comprising at least one accumulator, the system comprising:
means for measuring samples ($V_k$, $I_k$, $A_k$) of at least voltage ($V_k$), current ($I_k$) and cumulative capacity ($A_k$), at the terminals of said accumulator when said accumulator is charged or discharged;
a microprocessor programmed to implement the method according to claim 1.

32. A battery comprising at least one electrochemical accumulator, and at least one electronic management system according to claim 31.

33. A battery comprising a plurality of electrochemical accumulators arranged in modules and/or connected in series and/or in parallel, and at least one electronic management system according to claim 31.

* * * * *